(12) United States Patent
Tsuno et al.

(10) Patent No.: US 11,377,549 B2
(45) Date of Patent: Jul. 5, 2022

(54) HOT MELT COMPOSITION

(71) Applicant: HENKEL AG & CO. KGAA, Duesseldorf (DE)

(72) Inventors: Shingo Tsuno, Kanagawa (JP); Masaaki Dobashi, Kanagawa (JP); Takahide Morishita, Osaka (JP); Koji Shirai, Osaka (JP)

(73) Assignee: HENKEL AG & CO. KGaA, Dusseldorf (DE)

( * ) Notice: Subject to any disclaimer, the term of this patent is extended or adjusted under 35 U.S.C. 154(b) by 54 days.

(21) Appl. No.: 16/881,369

(22) Filed: May 22, 2020

(65) Prior Publication Data

US 2020/0283616 A1 Sep. 10, 2020

Related U.S. Application Data

(63) Continuation of application No. PCT/JP2018/043887, filed on Nov. 21, 2018.

(30) Foreign Application Priority Data

Nov. 28, 2017 (JP) .............................. JP2017-228106

(51) Int. Cl.
| | |
|---|---|
| C08L 53/02 | (2006.01) |
| C08L 91/06 | (2006.01) |
| C09J 153/02 | (2006.01) |
| H05K 5/06 | (2006.01) |

(52) U.S. Cl.
CPC ............... *C08L 53/02* (2013.01); *C08L 91/06* (2013.01); *C09J 153/02* (2013.01); *H05K 5/06* (2013.01)

(58) Field of Classification Search
CPC ............ C08L 53/02; C08L 91/06; H05K 5/06
See application file for complete search history.

(56) References Cited

U.S. PATENT DOCUMENTS

| | | | |
|---|---|---|---|
| 6,663,975 B1 | 12/2003 | Toyosawa et al. | |
| 10,975,272 B2 | 4/2021 | Kurokawa et al. | |
| 2014/0349127 A1 | 11/2014 | Minamide et al. | |

FOREIGN PATENT DOCUMENTS

| | | |
|---|---|---|
| CA | 3025143 A1 | 12/2017 |
| EP | 1101796 A1 | 5/2001 |
| JP | 2001-192527 A | 7/2001 |
| JP | 2001-192642 A | 7/2001 |
| JP | 2001-316561 A | 11/2001 |
| JP | 2004-189844 A | 7/2004 |
| JP | 2006-206644 A | 8/2006 |
| JP | 2008-285612 A | 11/2008 |
| JP | 2016-204588 A | 12/2016 |
| JP | 2017-214479 A | 12/2017 |
| WO | 2013/105392 A1 | 7/2013 |
| WO | 2017/209309 A1 | 12/2017 |

OTHER PUBLICATIONS

European Search Report EP 18883290.1-1102/3717566 PCT/JP2018/043887 Completed: Jun. 28, 2021; dated Jul. 8, 2021 19 Pages.

*Primary Examiner* — Arrie L Reuther
(74) *Attorney, Agent, or Firm* — Sun Hee Lehmann; Steven C. Bauman

(57) ABSTRACT

An objective of the present invention is to provide a hot melt composition which has a high form maintaining property at a high temperature, is well-balanced between adhesion and removability to a substrate, hardly sags, has less volatile matter content and is excellent in hygiene. The present invention relates to a hot melt composition comprising: (A) a thermoplastic block copolymer which is a copolymer of a vinyl-based aromatic hydrocarbon and a conjugated diene compound, (B1) a hydrocarbon-based oil having an aniline point of 135° C. or more, and (C) a wax modified with a carboxylic acid and/or a carboxylic acid anhydride.

5 Claims, No Drawings

HOT MELT COMPOSITION

FIELD OF THE INVENTION

The present invention relates to a hot melt composition, and particularly to a hot melt composition suitable as a sealing material for an electronic control unit for a vehicle.

BACKGROUND OF THE INVENTION

In recent years, automobiles are equipped with an ECU (Electronic Control Unit) that drives and controls an engine, an automatic transmission, an electric power steering and the like, as well as equipped with a large number of sensors that detect driving informations of an engine and a car body and output the detection signals to their ECU. ECUs and the like include a seal portion for sealing it at its periphery in order to provide waterproofing, oilproofing, dustproofing and the like to protect a substrate on which a microcomputer or an electronic component such as ROM and RAM is mounted in an electronic circuit. A PCU (Power Control Unit) comprising an inverter or a converter may also include a seal portion for sealing it at its periphery in order to provide waterproofing, oilproofing, dustproofing and the like.

A silicone resin has been sometimes used as a sealing material for the sealing portion of the electronic control unit. However, in the case where there is a defect in the electronic circuit substrate constituting the electronic control unit, the silicone resin cannot be removed from the substrate, and as a result, it has been necessary to replace a whole electronic control unit. In recent years, a hot melt composition comprising a thermoplastic resin component has been studied in consideration of the removability of the sealing material.

JP 2008-285612 and JP 2004-189844 disclose that a hot melt composition containing a styrene-based block copolymer which is a thermoplastic resin and various additives is used as a sealing material of an electronic control unit.

JP 2008-285612 discloses that a hot melt composition comprising a styrene-based block copolymer and a specific phenyl compound is not deteriorated even when exposed to high temperature for a long time and is excellent in removability ([Claim 1], [0001]). JP 2004-189844 discloses that a hot melt composition comprising a styrene block copolymer having a high molecular weight, a polyphenylene compound, an antioxidant and the like is excellent in removability even when used for a long time under heating ([Claim 1], [0001]).

SUMMARY OF THE INVENTION

Technical Problem

In recent years, it has been demanded that sealing materials are excellent in both of removability and adhesion at a high level. However, the hot melt compositions of JP 2008-285612 and JP 2004-189844 are still insufficient in removability, and further improvement has been required. In addition, since the hot melt composition of JP 2008-285612 and JP 2004-189844 comprise a large amount of antioxidant and various compounds, when it is exposed to high temperature conditions for a long time, part of the components may volatilize, which is undesirable for hygiene. Further, there has been a problem that when the hot melt compositions of JP 2008-285612 and JP 2004-189844 are applied to the substrate of the ECU, sagging from the substrate may generate.

Therefore, development of a hot melt composition which is excellent in both of adhesiveness and removability to the ECU, hardly deformed even at high temperatures, hardly vaporized to effect no adverse influence on the human body, and easy in application work has been desired. Particularly in recent years, considering the long-term use of the ECU, the hot melt composition having a small increase in adhesion (adhesion strength) over time and being easy to be removed from the ECU even after used for a long time has been strongly desired.

Solution to Problem

As a result of intensive studies to solve the above problems, the inventors of the present invention have found that when a specific oil and a specific wax are blended in addition to a thermoplastic block copolymer, a hot melt composition which is hygienically favorable without volatilization of components, excellent in adhesion to a substrate, easy to be removed and excellent in form maintaining property can be obtained, and thus they have completed the present invention.

The present invention and preferred embodiment of the present invention is as follows.

1. A hot melt composition comprising:
   (A) a thermoplastic block copolymer which is a copolymer of a vinyl-based aromatic hydrocarbon and a conjugated diene compound,
   (B) a hydrocarbon-based liquid softening agent, and
   (C) a wax modified with a carboxylic acid and/or a carboxylic acid anhydride,
   wherein the hydrocarbon-based liquid softening agent (B) comprises (B1) a hydrocarbon-based oil having an aniline point of 135° C. or more.

2. The hot melt composition according to the above item 1, wherein the thermoplastic block copolymer (A) is a hydrogenated block copolymer.

3. The hot melt composition according to the above item 1 or 2, wherein a content of the wax modified with a carboxylic acid and/or a carboxylic acid anhydride (C) is 0.1 to 10 parts by weight, based on 100 parts by weight of a total weight of the components (A), (B) and (C).

4. The hot melt composition according to any one of the above items 1 to 3, wherein the wax modified with a carboxylic acid and/or a carboxylic acid anhydride (C) comprises a polypropylene wax modified with maleic acid and/or maleic anhydride.

5. The hot melt composition according to any one of the above items 1 to 4, further comprising (D1) a tackifier resin having a softening point of 120° C. or more.

6. The hot melt composition according to any one of the above items 1 to 5, wherein the thermoplastic block copolymer (A) comprises (A1) a styrene-ethylene-ethylene/propylene-styrene block copolymer (SEEPS).

7. The hot melt composition according to any one of the above items 1 to 6, wherein the thermoplastic block copolymer (A) comprises (A2) a styrene-ethylene/propylene block copolymer (SEP).

8. The hot melt composition according to the above item 7, wherein based on 100 parts by weight of a total weight of the components (A), (B) and (C),
   (A1) a content of the styrene-ethylene-ethylene/propylene-styrene block copolymer (SEEPS) is 5 to 15 parts by weight and
   (A2) a content of the styrene-ethylene/propylene block copolymer (SEP) is 1 to 5 parts by weight.

9. An electronic control unit sealed with the hot melt composition according to any one of the above items 1 to 8.

10. A vehicle comprising the electronic control unit according to the above item 9.

Advantageous Effects of Invention

In the hot melt composition of the present invention, deformation hardly occurs and form maintaining property is high at a high temperature and adhesion property to a substrate is excellent, and it is possible to be removed from an ECU and the like in which this composition is used and thus the ECU and the like can be disassembled. Furthermore, since the hot melt composition of the present invention hardly volatilizes and hardly sags in applying work, it is easy for the operator to handle it.

In the present specification, "form maintaining property" is defined as difficulty to deform a hot melt composition at a high temperature. That is, the hot melt composition with less deformation at a high temperature is more excellent in form maintaining property and sagging thereof is hardly generated.

DETAILED DESCRIPTION OF THE INVENTION

Description of Embodiments

One embodiment of the present invention relates to a hot melt composition comprising (A) a thermoplastic block copolymer which is a copolymer of a vinyl-based aromatic hydrocarbon and a conjugated diene compound, (B) a hydrocarbon-based liquid softening agent, and (C) a wax modified with a carboxylic acid and/or a carboxylic acid anhydride. In one embodiment of the hot melt composition of the present invention, the hydrocarbon-based liquid softening agent (B) comprises (B1) a hydrocarbon-based oil having an aniline point of 135° C. or more. Each component will be explained below.

<(A) Thermoplastic Block Copolymer which is a Copolymer of a Vinyl-Based Aromatic Hydrocarbon and a Conjugated Diene Compound (Component (A))>

The thermoplastic block copolymer (A) which is a copolymer of a vinyl-based aromatic hydrocarbon and a conjugated diene compound (hereinafter, simply described as "a thermoplastic block copolymer (A)" or "component (A)") is a copolymer obtained by block copolmerization of a vinyl-based aromatic hydrocarbon and a conjugated diene compound (including copolymers in which the copolymers are further copolymerized).

The "thermoplastic block copolymer (A)" may be a block copolymer having a vinyl-based aromatic hydrocarbon block and a conjugated diene compound block (non-hydrogenated block copolymer), or a hydrogenated block copolymer in which the block copolymers are hydrogenated. Considering the balance of removability and adhesion property of the hot melt composition, it is preferable to comprise a hydrogenated block copolymer. The thermoplastic block copolymer (A) may be used alone or in combination of two or more.

Here, the "vinyl-based aromatic hydrocarbon" means an aromatic hydrocarbon compound having a vinyl group, and specific examples thereof include styrene, o-methylstyrene, p-methylstyrene, p-tert-butylstyrene, 1,3-dimethylstyrene, α-methylstyrene, vinylnaphthalene and vinylanthracene. Particularly, styrene is preferred. These vinyl-based aromatic hydrocarbons may be used alone or in combination of two or more.

The "conjugated diene compound" means a diolefin compound having at least a pair of conjugated double bonds. Specific examples of the "conjugated diene compound" include 1,3-butadiene, 2-methyl-1,3-butadiene (or isoprene), 2,3-dimethyl-1,3-butadiene, 1,3-pentadiene and 1,3-hexadiene. 1,3-butadiene and 2-methyl-1,3-butadiene are particularly preferred. These conjugated diene compounds may be used alone or in combination of two of more.

As the "non-hydrogenated block copolymer", specific examples include those in which blocks based on the conjugated diene compounds are not hydrogenated. As the "hydrogenated block copolymer", specific examples include block copolymers in which all or a part of the blocks based on the conjugated diene compounds are hydrogenated.

The hydrogenated ratio of the "hydrogenated block copolymer" is represented by the "hydrogenation ratio". "Hydrogenation ratio" of the "hydrogenated block copolymer" refers to a ratio of double bonds converted to saturated hydrocarbon bonds by hydrogenation based on the total aliphatic double bonds contained in the blocks based on the conjugated diene compounds. The "hydrogenation ratio" may be measured by an infrared spectrophotometer, a nuclear magnetic resonance device and the like. For example, the hydrogenation ratio of the styrene-ethylene-ethylene/propylene-styrene block copolymer (SEEPS) which may be used in the present invention is preferably 80% or more, more preferably 90% or more and may be 100%.

The weight average molecular weight (Mw) of the thermoplastic block copolymer (A) is not particularly limited, but it is preferably from 50,000 to 500,000, and more preferably 150,000 to 400,000. When the weight average molecular weight of the thermoplastic block copolymer (A) is within the above range, the hot melt composition which is excellent in form maintaining property, shear adhesive strength and removability can be obtained. In the present specification, the weight average molecular weight and the number average molecular weight are measured by gel permeation chromatography (GPC) using a calibration curve using monodisperse molecular weight polystyrene as a standard substance to convert molecular weight.

It is preferred that the thermoplastic block copolymer (A) comprises a styrene block, and a styrene content is not particularly limited, but it is preferably 5 to 50 wt %, and more preferably 10 to 40 wt %. The styrene content refers to the ratio of styrene block contained in the thermoplastic block copolymer (A). When the styrene content of the thermoplastic block copolymer is within the above range, the hot melt composition is excellent in heat resistance.

In the hot melt composition of the present invention, the thermoplastic block copolymer (A) preferably comprises "(A1) a styrene-ethylene-ethylene/propylene-styrene block copolymer (SEEPS)" (also describes as "component (A1)"), which is a hydrogenated block copolymer. The styrene-ethylene-ethylene/propylene-styrene block copolymer (SEEPS) (A1) is a hydrogenated product of a block copolymer composed of a styrene-butadiene-isoprene-styrene.

The SEEPS (A1) is swollen with a liquid softening agent such as process oil, imparts rubber elasticity to the hot melt composition, and can exhibit high heat-resistance, adhesion and strength as a sealing agent. During application of the hot melt composition, SEEPS exhibits fluidity as a thermoplastic resin by heating. Examples of commercial products of SEEPS include SEPTON 4033, SEPTON 4044, SEPTON 4055, SEPTON 4077 and SEPTON 4099 manufactured by Kuraray Co., Ltd.

In one embodiment of the present invention, the hot melt composition comprises, as the thermoplastic block copolymer (A), preferably "(A2) a styrene-ethylene/propylene block copolymer (SEP)" (also described as "component (A2)"), more preferably the SEP (A2) in addition to the SEEPS (A1).

The styrene-ethylene/propylene block copolymer (SEP) (A2) is a hydrogenated product of a block copolymer composed of styrene-isoprene. Since SEP is an A-B type hydrogenated block copolymer, the styrene block is present only at one terminal end and the conjugated diene compound is present at the other terminal end. The presence of the conjugated diene compound at the terminal end improves compatibility with a paraffinic process oil and the like and makes it possible to impart a tack to the hot melt composition.

In the styrene-ethylene/propylene block copolymer (SEP) (A2), a styrene block, which is a block part of an aromatic vinyl compound, can adhere tightly to PC (polycarbonate) and the like, and an ethylene/propylene block, which is a block part of conjugated diene compounds, can adhere tightly to PP (polypropylene). Therefore, the SEP (A2) can contribute particularly to the stabilization of the adhesion strength between two plastic adherends having different polarities. Examples of the commercial products of SEP include KRATON G1701, G1702HU manufactured by KRATON corporation and SEPTON 1001, SEPTON 1020 and the like manufactured by Kuraray Co., Ltd.

In the present invention, the thermoplastic block copolymer (A) may contain other block copolymers (A3) within a range not adversely affecting the present invention. Examples of other block copolymers (A3) include hydrogenated block copolymers other than (A1) SEEPS and (A2) SEP and non-hydrogenated block copolymers. Examples of the hydrogenated product of the thermoplastic block copolymer include a styrene-ethylene/propylene-styrene block copolymer (also referred to as "SEPS") in which a styrene-isoprene-styrene block copolymer is hydrogenated, a styrene-ethylene/butylene-styrene copolymer (also referred to as "SEBS") in which a styrene-butadiene-styrene block copolymer is hydrogenated. Examples of the non-hydrogenated block copolymer include styrene-isoprene-styrene block copolymer (also referred to as "SIS") and styrene-butadiene-styrene block copolymer (also referred to as "SBS").

In the hot melt composition of the present invention, the content of the component (A) based on 100 parts by weight of the total weight of the component (A), the component (B) and the component (C) is preferably 5 parts by weight or more, more preferably 6 parts by weight or more, and the upper limit is preferably 25 parts by weight or less, more preferably 20 parts by weight or less, further preferably 15 parts by weight or less.

The content of the component (A) based on 100% by weight of the total amount of the hot melt composition is preferably 5% by weight or more, more preferably 6% by weight or more, and the upper limit is preferably 20% by weight or less, more preferably 15% by weight or less. When the content of the thermoplastic block copolymer (A) is 5% by weight or more, the hot melt composition is excellent in heat resistance, adhesion and strength. When it is 20% by weight or less, the shear adhesive strength of the hot melt composition does not become excessively high and disassembly is easy.

When the hot melt composition of the present invention comprises (A1) SEEPS, the content of the component (A1) based on 100 parts by weight of the total weight of the component (A), the component (B) and the component (C) is preferably 5 to 15 parts by weight, more preferably 5 to 10 parts by weight, further preferably 6 to 10 parts by weight. When the content of the component (A1) is within the above range, the balance of removability and adhesion of the hot melt composition is improved at a higher level.

The content of the component (A1) based on the total amount of the hot melt composition of the present invention is preferably 1 to 14% by weight, more preferably 2 to 10% by weight, further preferably 3 to 8% by weight.

When the thermoplastic block copolymer (A) comprises (A2) styrene-ethylene/propylene block copolymer (SEP), the content of (A2) SEP based on 100 parts by weight of the total weight of the component (A), the component (B) and the component (C) is preferably 1 to 5 parts by weight, more preferably 1 to 3 parts by weight. When the content of the component (A2) is within the above range, the hot melt composition is hardly deformed at a high temperature, is excellent in adhesion to the ECU and is easy to be removed.

In one embodiment of the present invention, it is preferred that the hot melt composition comprises both component (A1) and component (A2) as component (A), and the content of the component (A1) is 5 to 15 parts by weight and the content of the component (A2) is 1 to 5 parts by weight, based on 100 parts by weight of the total weight of component (A), component (B) and component (C).

<(B) Hydrocarbon-Based Liquid Softening Agent>

(B) a hydrocarbon-based liquid softening agent (also referred to simply as "component (B)") is blended for the purpose of adjusting the melt viscosity of the hot melt composition, imparting flexibility and improving wettability to the adherend. The hydrocarbon-based liquid softening agent is mainly composed of carbon and hydrogen, and is in a liquid state at a room temperature (about 23° C.). Here, the "liquid state at a room temperature" means that it has fluidity at about 23° C. and 1 atm, preferably means a state in which the viscosity measured at 23° C. by an E type viscometer (cone angle of 3°, rotation speed of 100 times/minute) is 1000 Pa·s or less. "Softening agent" refers to the compound having a function of lowering the hardness of the composition and lowering the viscosity. The hydrocarbon-based liquid softening agent may have hetero atoms such as oxygen atom, nitrogen atom and sulfur atom. Examples of the hydrocarbon-based liquid softening agent include hydrocarbon-based oil such as paraffinic, naphthenic or aromatic-based process oil, liquid paraffin and olefin process oil; and liquid resins such as liquid rubber including liquid polybutene, liquid polybutadiene and liquid polyisoprene. Among these, hydrocarbon-based oil is preferable, and a process oil is more preferable. Examples of commercial products of the process oil include Diana Process Oil manufactured by Idemitsu Kosan Co., Ltd.

In the present invention, the hydrocarbon-based liquid softening agent (B) comprises "(B1) a hydrocarbon-based oil having an aniline point of 135° C. or more" (also simply referred to as "component (B1)"). Since the aniline point of the component (B1) is higher than aniline points of the oils generally used in ordinary hot melt compositions, the melt viscosity of the hot melt composition is increased. As a result, the hot melt composition of the present invention can maintain its form at a high temperature, deformation is suppressed, and excellent form maintaining property can be achieved. The upper limit of the aniline point of the hydrocarbon-based oil of component (B1) is not particularly limited, but it is preferably 170° C. or less.

In the present specification, the aniline point is defined as the lowest temperature at which equal volumes of aniline and a sample are uniformly present as a solution thereof, which is determined by a test method such as a test tube method, a U-tube method, a thin film method, as described in JIS 2256, K 2520. The temperature is increased while the mixture of aniline and the sample are stirred to form a uniform and transparent solution. Subsequently, from the state of uniform and transparent solution, the temperature is lowered and then, the temperature at which turbidity begins is measured. The aniline point is related to the rubber swellability of lubricating oil and process oil. The oil having a lower aniline point has higher solubility.

Since the hydrocarbon-based oil of the component (B1) of the present invention has a high aniline point of 135° C. or more and a high molecular weight, it's volatility is small and affinity with a block part based on a conjugated diene compound of the thermoplastic block copolymer (A) is high. As the component (B1), a process oil having an aniline point of 135° C. or more is preferable, and a paraffin-based process oil having an aniline point of 135° C. or more is more preferable.

When the ECU which is sealed with a conventional hot melt composition is used for a long time, there has been a problem that an adhesive strength has become high due to volatilization of the oil and the like in the composition and thereby disassembly property deteriorates. On the other hand, in the hot melt composition of the present invention, since the component (B1) continues to permeate into the block part based on a conjugated diene compound of the thermoplastic block copolymer (A), the adhesive strength of the hot melt composition does not continue to increase with time and thus stable disassembly property can be maintained even after used for a long time.

In the hot melt composition of the present invention comprising the thermoplastic block copolymer (A) and the oil (B1) having an aniline point of 135° C. or more, since the component (B1) has a high molecular weight, the viscosity of the hot melt composition can be increased and form maintaining property and heat resistance can be enhanced.

As described above, since the hot melt composition of the present invention comprises the hydrocarbon-based oil (B1) having an aniline point of 135° C. or more, it is particularly suitable for sealing materials for Electronic Control Unit (ECU) of an automobile and the like and it is excellent in disassembly property when the ECU is repaired. Further, because of its excellent heat resistance, it is possible to achieve long-term stable physical properties (adhesion property, removability). Moreover, the hot melt composition of the present invention can satisfy both good applying property and high form maintaining property. By high heat resistance and form maintaining property, it is possible to reduce the content of additives such as highly volatile antioxidants. Thus, even when each component is melted by heating at a high temperature for a long time at the time of producing the hot melt composition of the present invention, volatilization of the additive components hardly occurs, which is hygienically favorable.

Examples of the hydrocarbon-based oil (B1) having an aniline point of 135° C. or more include a process oil such as a paraffin oil derived from a paraffinic crude oil, an aromatic oil and a naphthene oil derived from a naphthenic crude oil, which respectively have aniline points of 135° C. or more. Commercial products thereof include Diana Process Oil PW-380 and Diana Process Oil PW-430. As the component (B1), one kind may be used alone or two or more kinds may be used in combination.

The hydrocarbon-based liquid softening agent (B) may comprise (B2) other hydrocarbon-based liquid softening agents (also referred to as "component (B2)") in addition to the hydrocarbon-based oil (B1) having an aniline point of 135° C. or more.

The aniline point of other hydrocarbon-based liquid softening agents (B2) is preferably less than 135° C., more preferably 130° C. or less, and the lower limit is not particularly limited but is preferably 100° C. or more. Further, component (B2) is preferably a hydrocarbon-based oil having an aniline point of less than 135° C.

In the hot melt composition of the present invention, the content of the component (B1) based on 100 parts by weight of the component (B) is preferably 30 parts by weight or more, more preferably 50 parts by weight or more, further preferably 60 parts by weight or more, and may be 100 parts by weight. The content of the component (B1) in the total amount of the hot melt composition is preferably about from 10 wt % to 70 wt %.

In one embodiment of the present invention, it may be sometimes preferable that the hot melt composition comprises both of the component (B1) and the component (B2) because the composition having a relatively low viscosity and high applying property may be obtained.

The content of the hydrocarbon-based liquid softening agent (B) based on 100 parts by weight of the total amount of the components (A), (B) and (C) is preferably 40 parts by weight or more, more preferably 50 parts by weight or more, further preferably 60 parts by weight or more, and the upper limit is preferably 95 parts by weight or less, more preferably 92 parts by weight or less. The content of the hydrocarbon-based oil (B1) having an aniline point of 135° C. or more based on 100 parts by weight of the total amount of the components (A), (B) and (C) is preferably 35 parts by weight or more, more preferably 40 parts by weight or more, and the upper limit is preferably 95 parts by weight or less, more preferably 92 parts by weight or less.

The content of the component (B) based on the total amount of the hot melt composition is preferably 30 wt % or more, more preferably 40 to 80 wt %, and further preferably 40 to 70 wt %. When the content of the component (B) is 30 wt % or more, the hot melt composition is excellent in form maintaining property at a high temperature and also disassembly property is excellent even after long-term use. When the content is 80 wt % or less, suitable form maintaining property of the hot melt composition can be obtained.

<(C) Wax Modified with a Carboxylic Acid and/or a Carboxylic Acid Anhydride (Component (C))>

In the present specification, the "wax" refers to an organic substance which is solid at room temperature (at about 23° C.) and turned into a liquid when heated, has a weight average molecular weight of less than 10,000, and is generally considered as "wax". The wax is not particularly limited as long as it has wax-like properties and it provides the hot melt adhesive according to the present invention can be obtained. In the present invention, "being solid at room temperature" means a state having no fluidity at about 23° C. and under 1 atm.

In the present invention, the "(C) wax modified with a carboxylic acid and/or a carboxylic acid anhydride" refers to a wax which is chemically or physically processed with at least one selected from the group consisting of a carboxylic acid or a carboxylic acid anhydride, and there is no particular limitation as long as the objective hot melt adhesive of the present invention can be obtained. Examples of chemical or physical processing include oxidation, polymerization, blending, synthesis and the like.

The component (C) preferably comprises a polyolefin wax modified with a carboxylic acid and/or a carboxylic acid anhydride. The "polyolefin wax" may be an olefin homopolymer wax obtained by polymerizing one kind of olefin, or an olefin copolymer wax obtained by copolymerizing two or more olefins. Examples of the olefin homopolymer wax include polyethylene wax and polypropylene wax, and polypropylene wax is particularly preferable. Examples of the olefin copolymer wax include polyethylene/polypropylene wax, polyethylene/polybutylene wax, polyethylene/polybutene wax and the like, and polyethylene/polypropylene wax is preferable.

Examples of the component (C) include a wax which is obtained by graft polymerization of a carboxylic acid and/or a carboxylic acid anhydride to an olefin wax; and a wax obtained by copolymerizing a carboxylic acid compound and/or a carboxylic acid anhydride compound when an olefin wax is synthesized by polymerization. Therefore, the component (C) may be an olefin wax which is modified as a result of introduction of a carboxylic acid and/or a carboxylic acid anhydride into the "polyolefin wax" using various reactions. The position where the carboxylic acid and/or the carboxylic acid anhydride is introduced is not particularly limited.

There is no particular limitation on the "carboxylic acid" and the "carboxylic acid anhydride" to be used to modify the polyolefin wax as long as the objective hot melt adhesive of the present invention can be obtained. Examples of the carboxylic acid and carboxylic acid anhydride include maleic acid, maleic anhydride, fumaric acid, fumaric anhydride, itaconic acid, acrylic acid, methacrylic acid and the like. These carboxylic acids and/or carboxylic anhydrides may be used alone or in combination. Among these, maleic acid and maleic anhydride are preferable, and maleic anhydride is more preferable.

An acid value of the component (C) is not particularly limited, but it is preferably from 5 to 200 mgKOH/g, and more preferably from 20 to 160 mgKOH/g. The acid value can be measured in accordance with ASTM D1386.

The dropping point of the component (C) is not particularly limited, but it is preferably 100 to 180° C. The drop point can be measured in accordance with ASTM D 3954.

In the present invention, as the component (C), a polyolefin wax modified with maleic acid and/or maleic anhydride is preferable, and a polypropylene wax modified with maleic acid and/or maleic anhydride is particularly preferable.

By comprising the component (C), the hot melt composition of the present invention makes it possible to maintain a good balance between removability and adhesion property at a high level. In particular, it is possible to obtain a stable composition with little increase in adhesion over time and less volatile matter. Therefore, when the hot melt composition of the present invention is used as a seal for an ECU, it is easy to be removed from the ECU substrate and disassemble the ECU, and it is hygienically preferable.

As the wax (C) modified with a carboxylic acid and/or a carboxylic acid anhydride, a commercially available product may be used. Examples of the commercially available product include Licosene PP MA 6252 (trade name) manufactured by Clariant, Hiwax 2203 A manufactured by Mitsui Chemicals, Ceramer 1608 (trade name) manufactured by Toyo Petrolite Co., and AC-596 A and AC-596P (trade name) manufactured by Honeywell.

The content of "(C) a wax modified with a carboxylic acid and/or a carboxylic acid anhydride" based on 100 parts by weight of the total weight of component (A), component (B) and component (C) is preferably from 0.1 parts by weight to 10 parts by weight, more preferably from 0.2 parts by weight to 8.0 parts by weight.

The total content of the components (A), (B) and (C) based on the total weight of the hot melt composition is preferably 60% by weight or more, more preferably 70% by weight or more. The upper limit may be 100% by weight, but preferably 90% by weight or less, more preferably 85% by weight or less.

<(D) Tackifier Resin (Component (D))>

One embodiment of the hot melt composition of the present invention preferably further comprises (D) a tackifier resin (also referred to as "component (D)"). Component (D) preferably comprises "(D1) a tackifier resin having a softening point of 120° C. or more". Here, in the present specification, the softening point is a value measured by an automatic softening point apparatus (ring and ball type) according to the petroleum asphalt test based on JIS K 2207. When the softening point of the tackifier resin is within the above range, the fluidity of the polymer composition of the present invention is stabilized.

The content of the tackifier resin (D1) having a softening point of 120° C. or more based on 100 parts by weight of the component (D) is preferably 30 parts by weight or more, more preferably 50 parts by weight or more, and may be 100 parts by weight. When the hot melt composition of the present invention comprises the tackifier resin (D1) having a softening point of 120° C. or more, higher form maintaining property can be maintained.

The tackifier resin is not particularly limited, but examples thereof include a rosin resin, a terpene resin, a terpene phenol resin, an aromatic hydrocarbon modified terpene resin, a petroleum resin, a phenolic resin, an acrylic resin, a styrene-based resin (homopolymer or copolymer containing styrene or α-methylstyrene as a constituting unit. Examples of the commercially available product include Kristalex, Plastrin manufactured by Eastman Chemical Company.), and a styrene-acrylic copolymer resin. Specific examples include rosin compounds such as a natural rosin, a modified rosin, a glycerol ester of a natural rosin, a glycerol ester of a modified rosin, a pentaerythritol ester of a natural rosin, a pentaerythritol ester of a modified rosin, a hydrogenated rosin, a a pentaerythritol ester of a hydrogenated rosin; terpene compounds such as a copolymer of a natural terpene, a three-dimensional polymer of a natural terpene, an aromatic modified terpene resin, a hydrogenated derivative of an aromatic modified terpene resin, a terpene phenolic resin, a hydrogenated derivative of a terpene phenolic resin, terpene resin (a monoterpene, a diterpene, a triterpene, a polyperpene and the like), and a hydrogenated terpene resin; petroleum hydrocarbon compounds such as an aliphatic petroleum hydrocarbon resin (C5 resin), a hydrogenated derivative of an aliphatic petroleum hydrocarbon resin, an aromatic petroleum hydrocarbon resin (C9 resin), a hydrogenated derivative of an aromatic petroleum hydrocarbon resin, a dicyclopentadiene-based resin, a hydrogenated derivative of a dicyclopentadiene-based resin, a C5/C9 copolymer resin, a hydrogenated derivative of a C5/C9 copolymer resin, a cycloaliphatic petroleum hydrocarbon resin, a hydrogenated derivative of a cyclic aliphatic petroleum hydrocarbon resin. These tackifier resins can be used alone, or in combination. It is also possible to use, as the tackifier resin, a liquid type tackifier resin as long as it has a colorless to pale yellow color tone and has substantially no odor, and also has satisfactory thermal stability. Taking these characteristics into consideration comprehensively, the tackifier resin is a preferably hydrogenated derivative of resin and the like. As one embodiment of the present invention, from the viewpoint of adhesion, it is preferable to use a styrene-based tackifier resin.

Commercially available products may be used as the tackifier resin, examples of commercial product thereof include Easttack series and Endex series manufactured by Eastman Corporation.

The tackifier resin (D) may be used alone or in combination of two or more.

The content of the tackifier resin (D) based on the total amount of the hot melt composition may be 0 wt %, but it is preferably 15 wt % or more, more preferably 20 to 50 wt %, further preferably 20 to 40 wt %. When the content of the component (D) is 15 wt % or more, the adhesive strength of the hot melt composition is increased. When the content is 50 wt % or less, removability of the hot melt composition is improved.

The hot melt composition of the present invention may comprise additives commonly used in hot melt compositions. The additives are not particularly limited as long as the hot melt composition targeted by the present invention can be obtained. As such an additive, for example, an antioxidant, a plasticizer, an ultraviolet absorber, a pigment, a rheology control agent, wax other than the above the component (C) and the like may be added.

Examples of the "antioxidant" include phenol-based antioxidants, phosphite-based antioxidants, thioether-based antioxidants and amine-based antioxidant.

Examples of the "plasticizer" include a phthalate ester-based plasticizer, an alkylsulfonic acid-based plasticizer, an adipate ester-based plasticizer, an acetate-based plasticizer, a phosphate ester-based plasticizer and the like.

Examples of the "ultraviolet absorber" include benzotriazole, hindered amine, benzoate, benzotriazole and the like.

Examples of the "pigment" include carbon black, titanium oxide and the like.

Examples of the "rheology control agent" include fatty acid amide, fumed silica and the like. Examples of commercial products of the fatty acid amide include A-S-A T-1700, A-S-A T-1800 and the like manufactured by Itoh Oil Chemicals Co., Ltd.

The hot melt composition of the present invention may comprise "other waxes" other than the wax (C) modified with a carboxylic acid and/or a carboxylic acid anhydride as mentioned above.

Specific examples of the "other waxes" include:

synthetic waxes such as a Fischer-Tropsch wax and a polyolefin wax (for example, polyethylene wax, polypropylene wax and polyethylene/polypropylene wax);

petroleum waxes such as a paraffin wax and a microcrystalline wax; and natural waxes such as a castor wax.

The above-mentioned "other wax" may be modified. As a modifying substance, a polar group may be introduced, and various carboxylic acid derivatives may be used. Examples of the "carboxylic acid derivatives" may include the following:

carboxylic acid esters such as ethyl acetate and vinyl acetate;
acid halides such as benzoyl bromide;
acid halides such as benzoyl bromide;
amides such as benzamide, N-methylacetamide and N,N-dimethylformamide;
imides such as succinimide;
acyl azides such as acetyl azide;
hydrazides such as propanoyl hydrazide;
hydroxamic acids such as chloroacetylhydroxamic acid;
lactones such as γ-butyrolactone; and
lactams such as δ-caprolactam.

Note that the "other waxes" does not include the wax (C) modified with a carboxylic acid and/or a carboxylic acid anhydride.

The hot melt composition of the present invention may comprise a silane coupling agent, an epoxy resin, a glass balloon or the like in order to enhance adhesion to an adherend such as a metal and glass.

The hot melt composition of the present invention is produced by blending the above-mentioned components in a predetermined ratio, blending various additives as necessary, and mixing with heating and melting. Specifically, the above components were charged into a melt-mixing pot equipped with a stirrer and were mixed with heating to prepare the product.

The method of using the hot melt composition of the present invention is not particularly limited. For example, the hot melt composition of the present invention is melted by heating to preferably 180 to 225° C., more preferably 180 to 215° C. and is applied to an adherend (for example, a first member and/or a second member). The material of the second member may be the same as or different from that of the first member. A method may be exemplified in which the first member and the second member are joined to form a joined body when the hot melt composition is in a molten state, and then it is allowed to solidify under room temperature (about 23° C.) condition. When the hot melt composition of the present invention is applied to an adherend, various applicators may be used.

Examples of the adherend to which the composition of the present invention may be applied include plastics (for example, polyolefin such as polypropylene; polycarbonate; polybutylene terephthalate resin; acrylic resin; PET resin), wood, rubber, glass and metal. It is exemplified as a preferred embodiment to use for adhesion of polycarbonate resins or acrylic resins; or adhesion between polycarbonate resin or acrylic resin and polypropylene.

The hot melt composition of the present invention is also suitable for joining the above-mentioned adherends or different materials.

The hot melt composition according to the present invention may be used as industrial sealing agents such as for sealing electronic and electric components, automobile components, vehicle components and the like, and it is preferably used for bonding electronic control unit.

When the hot melt composition of the present invention is used in an electronic control unit of a vehicle component, it is used for sealing the cover and the main body. The material of the cover and the main body is not particularly limited. Examples of the material of the cover include transparent resins such as glass, polycarbonate, acrylic resin and PET. Examples of the material of the main body include a metal and a polyolefin such polypropylene or the like. The electronic control unit of the present invention has high adhesion to the hot melt composition and can be easily separated from the hot melt adhesive at the time of disassembly such as repair.

Further, the hot melt composition of the present invention may be used for joining waterproof packing parts of household appliances such as washing machines, dryers and refrigerators.

The vehicle of the present invention has an electronic control unit manufactured using the above-mentioned hot melt composition. Since the cover of the electronic control unit is not peeled off by heat or impact and the electronic control unit can be protected in a good condition, thereby allowing for safer vehicle travelling.

The vehicle according to the present invention is not particularly limited as long as it has the above electronic control unit. Specific examples of the vehicle include vehicles according to the Road Traffic Law such as railroad vehicles such as an electric railcar, a railroad car and a train, military vehicles such as a tank and an armored car, motor vehicles, motor bicycles (motorcycles), buses, and streetcars.

EXAMPLES

Hereinafter, the present invention will be described with reference to Examples and Comparative Examples, but these examples are for describing the present invention and do not limit the present invention at all.

The components used in the hot melt compositions of Examples and Comparative Examples are described below.
(A) Thermoplastic Block Copolymer
(A1-1) SEEPS (trade name: SEPTON 4055, styrene content: 30 wt %, manufactured by Kuraray Co., Ltd.)
(A1-2) SEEPS (trade name: SEPTON 4077, styrene content: 30 wt %, manufactured by Kuraray Co., Ltd.)
(A1-3) SEEPS (trade name: SEPTON 4099, styrene content: 30 wt %, manufactured by Kuraray Co., Ltd.)
(A2) SEP (trade name KRATON G1702HU, styrene content: 28 wt %, diblock content: 100 wt %, manufactured by Kraton corporation)
(B) Hydrocarbon-Based Liquid Softening Agent
(B1-1) paraffinic process oil (trade name: Diana Process Oil PW380, aniline point: 142.7° C., manufactured by Idemitsu Kosan Co., Ltd.)
(B1-2) paraffinic process oil (trade name: Diana Process Oil PS430, aniline point: 138° C., manufactured by Idemitsu Kosan Co., Ltd.)
(B2) paraffinic process oil (trade name: Diana Process Oil PW90, aniline point: 124.8° C., manufactured by Idemitsu Kosan Co., Ltd.)
(C) Wax Modified with a Carboxylic Acid and/or a Carboxylic Acid Anhydride
(C1) polypropylene wax modified with maleic acid (trade name: AC-596P, dropping point: 147° C., acid value: 43, manufactured by Honeywell)
(C2) polypropylene wax modified with maleic anhydride (trade name: Ricosen PP MA6252, dropping point: 140° C., acid value: 42, manufactured by Clariant (Japan) K.K.)

(D) Tackifier Resin
(D1) hydrogenated C5 resin (trade name: Easttack resin H142R, weight-average molecular weight: 1030, softening point: 142° C., manufactured by Eastman Chemical Company)
(D2) hydrogenated DCPD resin (trade name: Escorez 5320, softening point: 125° C., manufactured by Exxon Mobil)
(D3) pure C9 monomer resin (trade name: Endex 155, softening point: 152° C., manufactured by Eastman Chemical Company)
(E) Antioxidant
(E1) hindered phenol antioxidant (trade name: Irganox 1010, manufactured by BASF)
(E2) phosphorus antioxidant (trade name: IRGAFOS 168, manufactured by Ciba-Geigy)
(E3) hindered amine antioxidant (trade name: Tinuvin 765, manufactured by BASF)
(F) Other Waxes
(F1) low molecular weight polyolefin wax (trade name: HiWAX2203, melting point: 100° C., manufactured by Mitsui Chemicals, Inc.)
(F2) Fischer-Tropsch wax (trade name: Sasol wax C80, freezing point: 80° C., melting point: 88° C. or more, manufactured by Sasol wax)
(G) Other Additives
(G1) Silane coupling agent (trade name KBM-403, 3-glycidoxypropyltrimethoxysilane, manufactured by Shin-Etsu Silicone Co., Ltd.)
(G2) Bis A type epoxy resin (trade name: Epicron 860, epoxy equivalent: 245, manufactured by DIC Corporation)
(G3) Glass balloon (trade name: Glass Bubbles VS 5500, manufactured by 3M Company)
(H) Other Resins
(H1) modified polyphenylene ether (trade name: ZYLON 500H, softening point 120° C., manufactured by Asahi Kasei Corporation)
(H2) polyphenylene ether (trade name: Noryl Resin SA-120, Tg 165° C., softening point 210° C., molecular weight: 2400, manufactured by SABIC)

These components were blended in the blending ratios shown in Table 1, and melt-kneaded for 4 hours under reduced pressure by a heating kneader (TKV 0.5-1 type) manufactured by Toshin Co., Ltd. set at 200° C., to obtain hot melt compositions of Examples 1 to 9 and Comparative Examples 1 to 7. All numerical units relating to the composition (blending) of the hot melt compositions described in Table 1 are parts by weight.

TABLE 1

| material | Example | | | | | | | | | Comparative Example | | | | | | |
|---|---|---|---|---|---|---|---|---|---|---|---|---|---|---|---|---|
| | 1 | 2 | 3 | 4 | 5 | 6 | 7 | 8 | 9 | 1 | 2 | 3 | 4 | 5 | 6 | 7 |
| A1-1 | | | | | | | | | | 14.3 | 11.1 | 11.1 | 7.1 | | | |
| A1-2 | 2.8 | 2.7 | 2.8 | 2.8 | 2.8 | 2.8 | 2.8 | 2.6 | 2.7 | | | | | 2.8 | 2.8 | 2.8 | 3.4 |
| A1-3 | 4.5 | 4.3 | 4.5 | 4.5 | 4.5 | 4.5 | 4.5 | 4.2 | 4.4 | | | | | 4.4 | 4.5 | 4.5 | 5.4 |
| A2 | 2.2 | 2.2 | 2.2 | 2.2 | 2.2 | 2.2 | 2.2 | 2.1 | 2.2 | | | | | 2.2 | 2.2 | 2.7 |
| B1-1 | 64.6 | 62.5 | 64.6 | 64.6 | 90.2 | 64.6 | | 61.4 | 63.7 | | | | | 64.8 | | 57.1 |
| B1-2 | | | | | | | 64.6 | | | | | | | | | |
| B2 | 25.6 | 24.8 | 25.6 | 25.6 | | 25.6 | 25.6 | 24.3 | 25.3 | 85.7 | 88.9 | 88.9 | 85.7 | 25.7 | 90.2 | 31.3 |
| C1 | 0.3 | 0.3 | 0.3 | 0.3 | 0.3 | 0.3 | 0.3 | 5.3 | 1.6 | | | | | | 0.3 | |
| C2 | | 3.2 | | | | | | | | | | | | | | |
| D1 | 8.9 | 8.6 | 8.9 | 8.9 | 26.7 | 8.9 | 8.9 | 8.5 | 8.8 | 14.3 | 11.1 | 11.1 | 14.3 | 8.9 | 8.9 | 10.9 |
| D2 | 7.8 | 7.6 | 7.8 | 7.8 | 7.8 | 7.8 | 7.8 | 7.4 | 7.7 | | | | | 7.9 | 7.8 | 9.6 |
| D3 | 17.8 | 17.2 | 17.8 | 17.8 | | 17.8 | 17.8 | 16.9 | 17.6 | | | 22.2 | 21.4 | 17.9 | 17.8 | 21.8 |
| E1 | 0.6 | 0.6 | 0.6 | 0.6 | 0.6 | 0.6 | 0.6 | 0.6 | 0.6 | 2.9 | 2.2 | 2.2 | 2.9 | 0.6 | 0.6 | 0.7 |
| E2 | | | | | | | | | | 2.9 | 2.2 | 2.2 | 2.9 | | | |

TABLE 1-continued

| material | Example 1 | 2 | 3 | 4 | 5 | 6 | 7 | 8 | 9 | Comparative Example 1 | 2 | 3 | 4 | 5 | 6 | 7 |
|---|---|---|---|---|---|---|---|---|---|---|---|---|---|---|---|---|
| E3 | | | | | | | | | | 1.4 | 1.1 | 1.1 | 1.4 | | | |
| F1 | | | 3.3 | | | | | | | | | | | | | |
| F2 | | | | | | | | | | | | | | | | 4.8 |
| G1 | | | | | 0.6 | | | | | | | | | | | |
| G3 | | | | | | | | | | | | | 7.1 | | | |
| G2 | | | | | | | 5.6 | | | | | | | | | |
| H1 | | | | | | | | | | 7.1 | 5.6 | 5.6 | 3.6 | | | |
| H2 | | | | | | | | | | | | | 3.6 | | | |
| total | 135.2 | 134.0 | 138.5 | 135.7 | 135.2 | 140.7 | 135.2 | 133.4 | 134.7 | 128.6 | 122.2 | 144.4 | 157.1 | 135.3 | 135.2 | 147.7 |

For each hot melt composition, viscosity, form maintaining property (difficulty in sagging), shear test (index of adhesion and disassembly property), and evaporation residue (volatility) were evaluated.

Each evaluation will be described below. Evaluation results of each hot melt composition are shown in Tables 4 and 5.

<Viscosity Measurement>

Measurement was carried out using a rotational viscometer manufactured by Brookfield. Each adhesive of the Examples and Comparative examples was preliminarily melted at a predetermined temperature (220° C., 215° C., 210° C., 205° C.) for 30 minutes, respectively. A prescribed amount (11 g or more) of the melted hot melt adhesive was poured into a viscosity tube, the spindle was attached to the viscometer, and after melting for 15 minutes, the spindle was rotated for 1 minute to obtain a value as an initial value. A No. 28 rotor was used for viscosity measurement. The results obtained as initial values are shown in Table 4 as viscosity.

<Form Maintaining Property (Difficulty in Sagging)>

In order to evaluate the form maintaining property of each hot melt composition, a hot melt composition was poured into a polypropylene groove having a depth of 12 mm, a width of 7 mm and a length of 14 mm and left to stand in a dryer at a predetermined temperature (140° C. or 150° C.) for 24 hours at an angle of 70°, and the moving distance of the lower tip of the hot melt composition (i.e. the distance flowed out from the state immediately after being applied) was measured. The evaluation criteria based on the moving distance are shown in Table 2.

TABLE 2

| Evaluation Criteria for form maintaining property | |
|---|---|
| Evaluation | moving distance |
| ∘∘ | 0.0 mm |
| ∘ | more than 0.0 mm and less than 5.0 mm |
| x | 5.0 mm or more |

Table 4 shows the results. In Table 4, "form maintaining property immediately after being applied" denotes the moving distance of the lower tip of the hot melt composition immediately after pouring each hot melt composition into the polypropylene groove and inclining the groove to an angle of 70°.

<Evaporation Residue Measurement (Volatility)>

Evaporation residue was measured as indications of health damage at the time of working and performance deterioration of internal electronic parts due to adverse effects of volatile matter. About 1.0 g of each hot melt composition was weighed on an aluminum dish and weight measurements were conducted before drying and after drying at 150° C. for 24 hours, respectively, and the evaporation residues were calculated by the following equation.

Evaporation residue (%)=100×Weight after drying (g)/Weight before drying (g)

The evaluation criteria for measurement of evaporation residue are shown below.

TABLE 3

| | |
|---|---|
| ∘∘ | Evaporation residue is 99.7% or more. |
| ∘ | Evaporation residue is more than 99.5% and less than 99.7%. |
| x | Evaporation residue is 99.5% or less. |

<Shear Test (Indication of Adhesion and Disassembly Property)> (Shear Test of Initial Evaluation)

In order to evaluate adhesion and disassembly property to various substrates of each hot melt composition, two plates each having a width of 25 mm, a length of 100 mm, and a thickness of 3 mm were used, and the hot melt composition melted at 200° C. was applied to the plate, to prepare a shear test piece having an adhesive layer having a width of 25 mm and a length of 5 mm. The gap between two plates was about 2 mm.

As the plate for the shear test, PBT (polybutylene terephthalate resin), PC (polycarbonate), SPC (cold rolled steel plate/SPCC-SD), and PP (polypropylene) were used, respectively. As the plates used for each shear test, the materials of two plates were the same.

The shear test piece was set on a tensile tester (Tensilon® 250 type) and subjected to a tensile test at a tension speed of 50 mm/min at a temperature of 23° C. (room temperature), and the maximum load was measured. Shear adhesive strength (shear strength) was calculated from this maximum load (N) and adhesive area (mm$^2$).

In the shear test, the necessary value of adhesion to the substrate was set to 50 kPa, and the maximum value at which disassembly can be conducted without cohesive failure of the adhesive was set to 200 kPa. That is, a hot melt adhesive having a shear strength of 50 to 200 kPa (failure mode is interface failure (also referred to as AF (adhesion failure))) was accepted (∘), and a hot melt adhesive outside the above range was rejected (x). In Table 5, "C F" denotes that the failure mode is cohesive failure and the composition remained on the plate in the shear test. "AF/CF" denotes that both of the portion in which the failure mode is cohesive failure and the portion in which the failure mode is not cohesive failure were present.

(Shear Test after Heating at 125° C. for 1000 Hours)

Shear test pieces were prepared in the same manner as those in the initial shear test and cooled to room temperature, and then heated at 125° C. for 1000 hours in a circulation drying type oven. After heating was conducted, they were cooled to room temperature and stored at room temperature for 24 hours. Subsequently, the shear test piece was set on a tensile tester (Tensilon® 250 type) and subjected to a tensile test at a tension speed of 50 mm/min at a temperature of 23° C. (room temperature), and the maximum load was measured. Shear adhesive strength (shear strength) was calculated from this maximum load (N) and adhesive area (mm$^2$).

Evaluation results of the hot melt compositions of Examples and Comparative Examples are shown in Tables 4 and 5.

TABLE 4

| Results | | Example | | | | | | | |
|---|---|---|---|---|---|---|---|---|---|
| | | 1 | 2 | 3 | 4 | 5 | 6 | 7 | 8 |
| Viscosity | viscosity (220° C.) [mPa · s] | 47200 | 94500 | 121000 | 60400 | 47600 | 47700 | 22800 | 110800 |
| | viscosity (215° C.) [mPa · s] | 102500 | 247500 | 307000 | 136500 | 60000 | 132000 | 38500 | 302000 |
| | viscosity (210° C.) [mPa · s] | 206500 | 426500 | 390000 | 137000 | 288500 | 274500 | 75500 | 363000 |
| | viscosity (205° C.) [mPa · s] | 388000 | 500000 or more | 460000 | 137500 | 394000 | 494500 | 151500 | 387000 |
| Form maintaining property | immediately after *1) (70°) [mm] | 0 | 0 | 0 | 0 | 0 | 0 | 0 | 0 |
| | after heating *2) (140° C.) [mm] | 0 | 0 | 0 | 0 | 0 | 0 | 0 | 0 |
| | after heating *2) (150° C.) [mm] | 0 | 0 | 0 | 0 | 0 | 0 | 0 | 0 |
| | Evaluation | ○ ○ | ○ ○ | ○ ○ | ○ ○ | ○ ○ | ○ ○ | ○ ○ | ○ ○ |
| Evaporation residue | Evaporation residue [%] | 99.80 | 99.77 | 99.67 | 99.62 | 99.78 | 99.76 | 99.63 | 99.79 |
| | Evaluation | ○ ○ | ○ ○ | ○ | ○ | ○ ○ | ○ ○ | ○ | ○ ○ |

| Results | | Example | Comparative Example | | | | | | |
|---|---|---|---|---|---|---|---|---|---|
| | | 9 | 1 | 2 | 3 | 4 | 5 | 6 | 7 |
| Viscosity | viscosity (220° C.) [mPa · s] | 53600 | 30000 | 6200 | 1500 | 108000 | 39000 | 1850 | 49100 |
| | viscosity (215° C.) [mPa · s] | 128000 | 55000 | 10000 | 1700 | 199000 | 77000 | 2250 | 109000 |
| | viscosity (210° C.) [mPa · s] | 248500 | 106000 | 19500 | 2000 | 380000 | 153000 | 3500 | 222000 |
| | viscosity (205° C.) [mPa · s] | 446000 | 198000 | 40000 | 3000 | 500000 or more | 289000 | 5750 | 416000 |
| Form maintaining property | immediately after *1) (70°) [mm] | 0 | 0 | 2 | 50 | 0 | 0 | 0 | 0 |
| | after heating *2) (140° C.) [mm] | 0 | 1 | 5 | 50 | 0 | 0 | 14 | 0 |
| | after heating *2) (150° C.) [mm] | 0 | 2 | 18 | 50 | 0 | 0 | 19 | 0 |
| | Evaluation | ○ ○ | ○ | x | x | ○ ○ | ○ ○ | x | ○ ○ |

TABLE 4-continued

| Evaporation residue | Evaporation residue [%] | 99.72 | 99.41 | 99.00 | 99.54 | 99.31 | 99.68 | 99.72 | 99.75 |
|---|---|---|---|---|---|---|---|---|---|
| | Evaluation | ⊙⊙ | x | x | ○ | x | ○ | ⊙⊙ | ⊙⊙ |

*[1)] immediately after = form maintaining property immediately after being applied
*[2)] after heating = form maintaining property after heating

TABLE 5

| Result of shear test initial | | Example | | | | | | | | | Comparative Example | | | | | | |
|---|---|---|---|---|---|---|---|---|---|---|---|---|---|---|---|---|---|
| | | 1 | 2 | 3 | 4 | 5 | 6 | 7 | 8 | 9 | 1 | 2 | 3 | 4 | 5 | 6 | 7 |
| PBT | Strength [kPa] | 150.0 | 184.1 | 178.0 | 125.7 | 52.4 | 106.0 | 126.0 | 156.2 | 177.6 | 20.7 | 15.3 | 235.1 | 214.2 | 132.5 | 156.3 | 164.2 |
| | Failure mode | AF | AF | AF | AF | AF | AF | AF | AF | AF | AF | AF | AF/CF | AF | AF | AF | AF |
| PC | Strength [kPa] | 145.6 | 181.6 | 104.4 | 187.1 | 53.8 | 100.4 | 150.0 | 118.2 | 163.4 | 56.3 | 50.3 | 396.4 | 147.0 | 103.1 | 249.8 | 175.9 |
| | Failure mode | AF | AF | AF | AF | AF | AF | AF | AF | AF | AF | AF | AF | AF | AF | AF | AF |
| SPC | Strength [kPa] | 58.3 | 102.9 | 60.5 | 55.0 | 51.1 | 53.8 | 70.1 | 93.4 | 141.3 | 20.8 | 10.4 | 189.5 | 88.1 | 74.3 | 53.7 | 90.9 |
| | Failure mode | AF | AF | AF | AF | AF | AF | AF | AF | AF | AF | AF | AF | AF | AF | AF | AF |
| PP | Strength [kPa] | 184.5 | 193.3 | 65.7 | 168.2 | 58.1 | 159.5 | 151.5 | 65.3 | 183.8 | 51.7 | 18.7 | 167.1 | 185.8 | 39.4 | 133.4 | 61.0 |
| | Failure mode | AF | AF | AF | AF | AF | AF | AF | AF | AF | AF | AF | AF | AF | AF | AF | AF |
| | Evaluation | ○ | ○ | ○ | ○ | ○ | ○ | ○ | ○ | ○ | x | x | x | x | x | x | ○ |

| Result of shear test after 1000 hours at 125° C. | | Example | | | | | | | | | Comparative Example | | | | | | |
|---|---|---|---|---|---|---|---|---|---|---|---|---|---|---|---|---|---|
| | | 1 | 2 | 3 | 4 | 5 | 6 | 7 | 8 | 9 | 1 | 2 | 3 | 4 | 5 | 6 | 7 |
| PBT | Strength [kPa] | 133.5 | 170.5 | 164.6 | 105.8 | 53.6 | 96.1 | 113.3 | 155.2 | 140.0 | 50.2 | 32.0 | 154.5 | 185.8 | 68.4 | 53.2 | 97.2 |
| | Failure mode | AF | AF | AF | AF | AF | AF | AF | AF | AF | AF | AF | AF/CF | AF | AF | AF | AF |
| PC | Strength [kPa] | 116.9 | 174.3 | 92.4 | 124.1 | 52.4 | 79.9 | 138.6 | 117.7 | 136.3 | 96.6 | 91.8 | 152.3 | 204.0 | 105.3 | 237.0 | 234.3 |
| | Failure mode | AF | AF | AF | AF | AF | AF | AF | AF | AF | AF | AF | AF | AF | AF | AF | AF |
| SPC | Strength [kPa] | 54.1 | 78.2 | 79.6 | 58.1 | 56.2 | 67.2 | 68.0 | 88.9 | 120.3 | 24.0 | 51.5 | 209.4 | 258.2 | 26.0 | 72.4 | 101.8 |
| | Failure mode | AF | AF | AF | AF | AF | AF | AF | AF | AF | AF | AF | AF | AF | AF | AF | AF |
| PP | Strength [kPa] | 174.4 | 182.5 | 89.6 | 156.4 | 62.8 | 159.3 | 145.2 | 64.5 | 181.8 | 50.1 | 51.7 | 161.1 | 169.1 | 81.7 | 85.8 | 163.9 |
| | Failure mode | AF | AF | AF | AF | AF | AF | AF | AF | AF | AF | AF | AF | AF | AF | AF | AF |
| | Evaluation | ○ | ○ | ○ | ○ | ○ | ○ | ○ | ○ | ○ | x | x | x | x | x | ○ | x |

As shown in Tables 4 and 5, the hot melt compositions of Examples 1 to 9 were very excellent in form maintaining property and thus sagging was hardly generated. Moreover, since they have appropriate shear adhesive strengths to each adherend, they are excellent in balance between disassembly property (removability) and adhesion property. Furthermore, it is shown that the hot melt compositions of Examples 1 to 9 were hygienically suitable because evaporation residues are large and volatile matter content is small. In addition, it was confirmed that in the measurement of shear strength after 125 hours at 1000° C., the hot melt compositions of Examples 1 to 9 can maintain stable disassembly property (removability) and adhesion to each adherend after long-term use.

On the other hand, the hot melt compositions of Comparative Examples 1 to 7 showed that shear strength after 125 hours at 1000° C. and/or initial shear strengths were excessively large or excessively small, as compared with the hot melt composition of Examples. That is, it was shown that the members (for example, ECU) sealed with the hot melt compositions of Comparative Examples had insufficient adhesion or were difficult to disassemble in the initial stage or after the high temperature treatment.

In addition, the hot melt compositions of Comparative Examples 1, 2 and 4 showed small residues in the evaporation residue test as compared with Examples 1 to 9, and thus they are hygienically undesirable due to large volatile contents.

INDUSTRIAL APPLICABILITY

The present invention provides a hot melt composition suitable for adhesion of an electronic control unit for a vehicle. The hot melt composition of the present invention makes it easy to disassemble the seal portion during replacement or maintenance of electrical components in the electronic control unit. Further, since the hot melt composition of the present invention can maintain a balance between adhesion property and removability at a high level even after long-term treatment at high temperature, it is easy to seal and disassemble the electronic control unit which is used for a long time.

The invention claimed is:

1. An electronic control unit sealed with hot melt composition consisting of:
 (A) a mixture of styrene-ethylene/propylene block copolymer and styrene-ethylene-ethylene-propylene-styrene block copolymer;
 (B) a hydrocarbon-based oil having an aniline point of 135° C. or more;
 (C) a wax modified with a carboxylic acid and/or a carboxylic acid anhydride;
 (D) a mixture of a tackifier selected from the group consisting of hydrogenated C5 resin, hydrogenated DCPD resin, and pure C9 monomer resin; and
 (E) at least one optional component selected from the group consisting of antioxidant, polyolefin wax, Fischer-Tropsch wax, silane coupling agent, bis A epoxy resin, and glass balloons.

2. The electronic control unit sealed with the hot melt composition according to claim 1, wherein a content of the wax modified with a carboxylic acid and/or a carboxylic acid anhydride (C) is 0.1 to 10 parts by weight, based on 100 parts by weight of a total weight of the components (A), (B), (C) and (D).

3. The electronic control unit sealed with the hot melt composition according to claim 1, wherein the wax modified with a carboxylic acid and/or a carboxylic acid anhydride (C) is a polypropylene wax modified with maleic acid and/or maleic anhydride.

4. The electronic control unit sealed with the hot melt composition according to claim 1, wherein the tackifier has a softening point of 120° C. or more.

5. A vehicle comprising the electronic control unit according to claim 1.

* * * * *